(12) United States Patent
Huang et al.

(10) Patent No.: US 7,969,217 B2
(45) Date of Patent: Jun. 28, 2011

(54) OUTPUT BUFFER WITH SLEW-RATE ENHANCEMENT OUTPUT STAGE

(75) Inventors: Hung-Yu Huang, Tainan County (TW); Chin-Tien Chang, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/577,857

(22) Filed: Oct. 13, 2009

(65) Prior Publication Data
US 2011/0084745 A1    Apr. 14, 2011

(51) Int. Cl.
*H03K 5/12* (2006.01)
(52) U.S. Cl. .......................... 327/170; 327/108
(58) Field of Classification Search .................. None
See application file for complete search history.

(56) References Cited

U.S. PATENT DOCUMENTS

| | | | | |
|---|---|---|---|---|
| 5,623,216 A * | 4/1997 | Penza et al. | ..................... | 326/27 |
| 5,850,159 A * | 12/1998 | Chow et al. | ................... | 327/394 |
| 6,535,020 B1 * | 3/2003 | Yin | ................................ | 326/83 |
| 6,646,483 B2 * | 11/2003 | Shin | ............................... | 327/112 |
| 6,992,511 B2 * | 1/2006 | Suzuki | .......................... | 327/112 |
| 7,728,641 B2 * | 6/2010 | Lee | ............................... | 327/170 |

\* cited by examiner

*Primary Examiner* — Cassandra Cox
(74) *Attorney, Agent, or Firm* — Thomas|Kayden

(57) ABSTRACT

An embodiment of a slew-rate enhancement output stage is disclosed. A first slew-rate enhancement circuit receives a first control voltage and outputs a first voltage. A second slew-rate enhancement circuit receives a second control voltage and outputs a second voltage. A first PMOS transistor includes a first first terminal coupled to a high voltage source, a first control terminal receiving the first voltage, and a first second terminal coupled to a voltage output terminal. A first NMOS transistor includes a second first terminal coupled to the voltage output terminal, a second control terminal for receiving the second voltage, and a second second terminal coupled to a low voltage source. The first voltage is higher than the first control voltage, and the second voltage is lower than the second control voltage.

10 Claims, 5 Drawing Sheets

US 7,969,217 B2

OUTPUT BUFFER WITH SLEW-RATE ENHANCEMENT OUTPUT STAGE

BACKGROUND OF THE INVENTION

1. Field of the Invention

The present invention relates to an output buffer, and more particularly to an output buffer with a slew-rate enhancement output stage.

2. Description of the Related Art

In a conventional operational amplifier, high slew rate is achieved by increasing the current or decreasing compensation capacitance. If the operational amplifier is used to drive the pixel in LCD panel, the only way to increase slew rate is increasing the driving current. However, increasing the current may increase static current consumption, and deteriorate the stability of the operational amplifier.

BRIEF SUMMARY OF THE INVENTION

An embodiment of the invention provides a slew-rate enhancement output stage comprising a first slew-rate enhancement circuit receiving a first control voltage and outputting a first voltage; a second slew-rate enhancement circuit receiving a second control voltage and outputting a second voltage; a first PMOS transistor comprising a first first terminal coupled to a high voltage source, a first control terminal for receiving the first voltage, and a first second terminal coupled to a voltage output terminal; and a first NMOS transistor comprising a second first terminal coupled to the voltage output terminal, a second control terminal for receiving the second voltage, and a second second terminal coupled to a low voltage source, wherein the first voltage is higher than the first control voltage, and the second voltage is lower than the second control voltage.

An embodiment of the invention provides an output buffer with a slew-rate enhancement output stage, comprising an operational amplifier comprising a positive input terminal for receiving an input voltage, a negative input terminal for receiving an output voltage, and an output terminal for outputting the output voltage; a first PMOS transistor comprising a first first terminal coupled to a high voltage source, a first control terminal coupled to a first node inside the operational amplifier, and a first second terminal coupled to the output terminal of the operational amplifier; a first NMOS transistor comprising a second first terminal coupled the output terminal of the operational amplifier, a second control terminal coupled to a second node inside the operational amplifier, and a second second terminal coupled to a low voltage source; a first slew-rate enhancement circuit coupled to the first node and outputting a first voltage; a second slew-rate enhancement circuit coupled to the second node and outputting a second voltage; a second PMOS transistor comprising a third first terminal coupled to the high voltage source, a third control terminal for receiving the first voltage, and a third second terminal coupled to the output terminal of the operational amplifier; and a second NMOS transistor comprising a fourth first terminal coupled to the output terminal of the operational amplifier, a fourth control terminal for receiving the second voltage, and a fourth second terminal coupled to the low voltage source.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
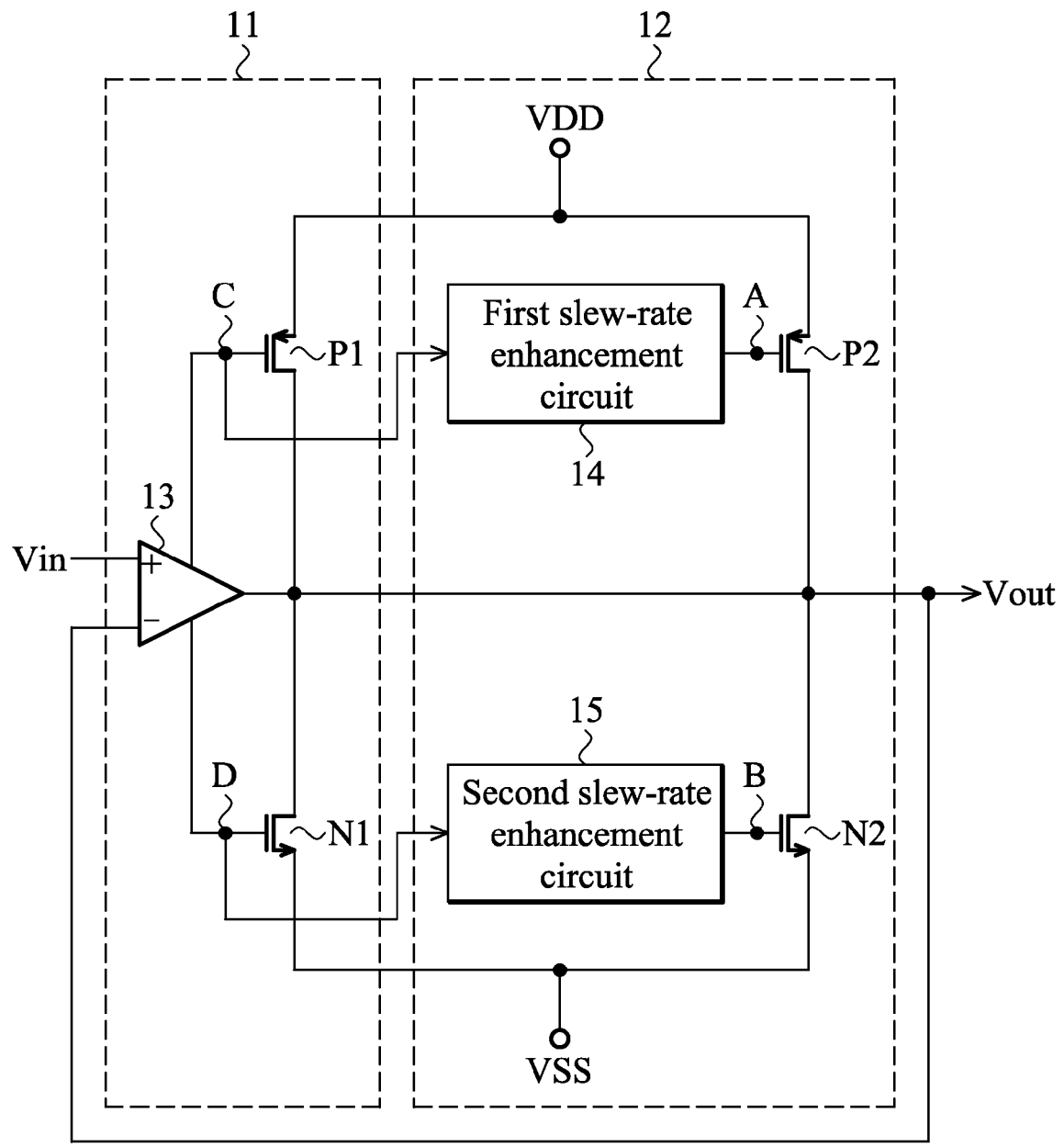
FIG. 1 is a schematic diagram of an embodiment of an output buffer with slew-rate enhancement output stage according to the invention.
Figure 2:
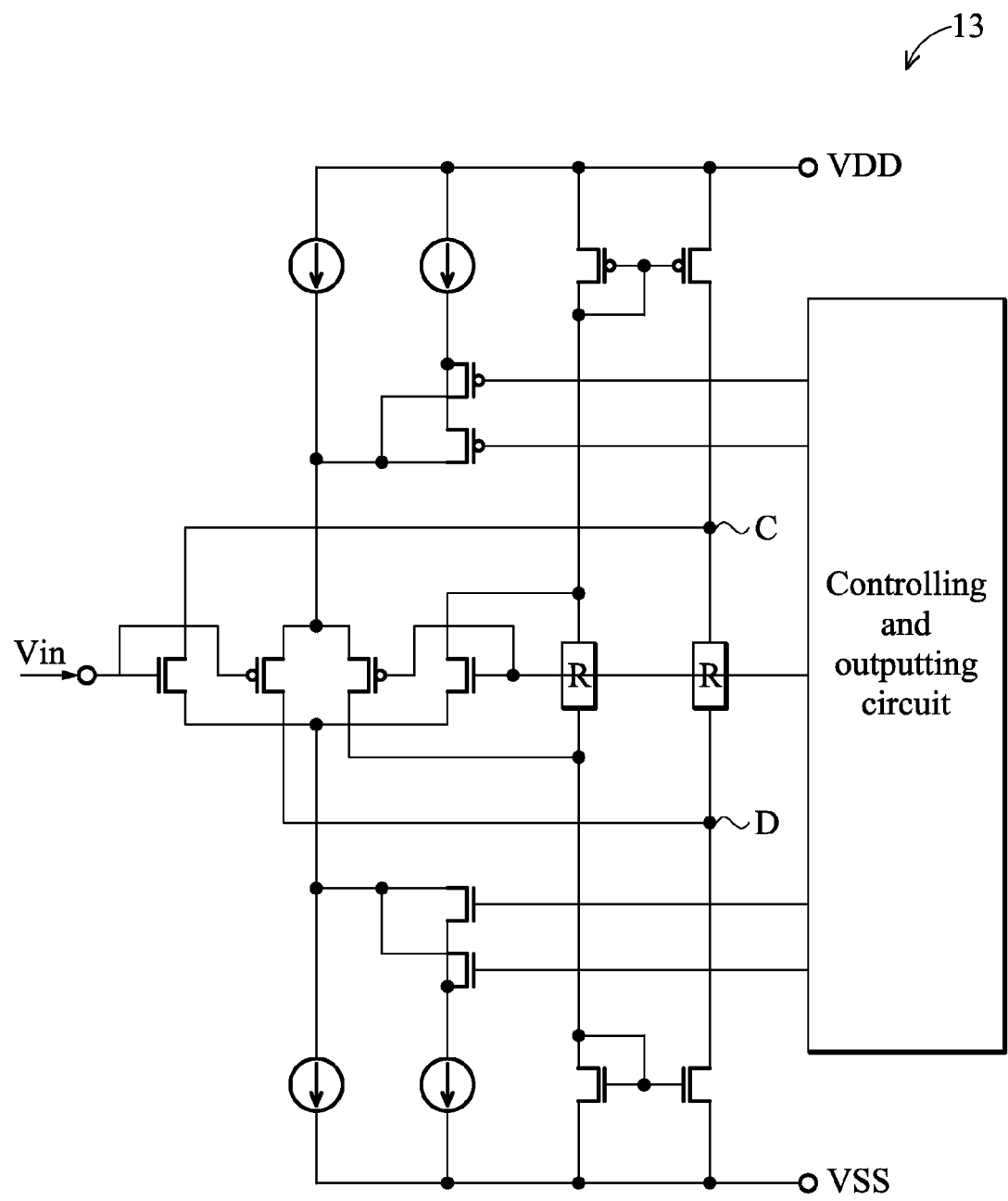
FIG. 2 shows the nodes C and D in the operational amplifier 13.

FIG. 1 is a schematic diagram of an embodiment of an output buffer with slew-rate enhancement output stage according to the invention. The slew-rate enhancement output stage 12 enhances the slew-rate of the output buffer 11. The output buffer 11 comprises an operational amplifier 13, PMOS transistor P1 and NMOS transistor N1. The operational amplifier 13 comprising two input terminals and one output terminal outputting an output voltage, wherein one input terminal receives an input voltage Vin and the other one input terminal receives the output voltage Vout. The slew-rate enhancement output stage 12 comprises a first slew-rate enhancement circuit 14, a second slew-rate enhancement circuit 15, PMOS transistor P2 and NMOS transistor N2. FIG. 2 shows the nodes C and D in an embodiment of the operational amplifier 13. When the input voltage Vin increases rapidly, the voltage level of the node C decreases rapidly and the voltage level of the node A also decreases rapidly. The PMOS transistor P2 is therefore turned on and the voltage VDD charges the output voltage Vout until the output voltage Vout is equal to the input voltage Vin.

When the input voltage Vin decreases rapidly, both the voltage level of the node D and the voltage level of the node B increase rapidly. The NMOS transistor N2 is therefore turned on and the output voltage Vout is discharged until the output voltage Vout is equal to the input voltage Vin. When the output voltage Vout is equal to the input voltage Vin, i.e., the output buffer 11 is at a stable condition, the first slew-rate enhancement circuit 14 controls the voltage level of the node A to be the voltage VDD, and the second slew-rate enhancement circuit 15 controls the voltage level of the node B to be the voltage VSS. Thus, the PMOS transistor P2 and NMOS transistor N2 are completely turned off, and no static current passes through the PMOS transistor P2 and NMOS transistor N2.

In a conventional design without the slew-rate enhancement output stage 12, the PMOS transistor P1 and the NMOS transistor N1 are used to provide large current to quickly charge or discharge the output voltage Vout, thus, the size, the ratio of W/L, of the PMOS transistor P1 and the NMOS transistor N1 are accordingly large. When the voltage of the node C or D becomes stable, there is still static power consumption caused by the PMOS transistor P1 and the NMOS transistor N1, and this decreases the performance of the output buffer 11. For example, assuming the voltage of VDD is 18V, when the output voltage Vout becomes stable, the voltage level of the node C is substantially 15V, the PMOS transistor P1 may be a slightly turned-on, and there may be a static current passing through the PMOS transistor P1. The static current therefore generates static power consumption. In the proposed design in FIG. 1, the PMOS transistor P2, not the PMOS transistor P1, provides the large current to charge the output voltage Vout. Thus, the size of PMOS transistor P1 can be reduced. Similarly, the size of NMOS transistor N1 can be also reduced.

Figure 3:
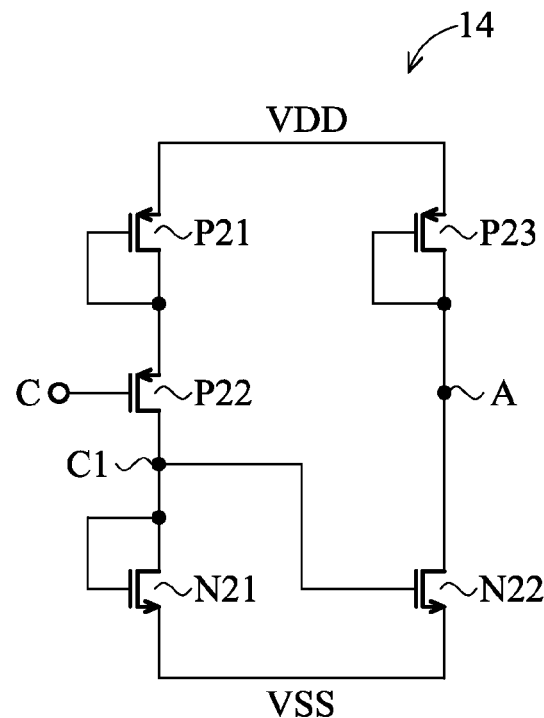
FIG. 3 is a schematic diagram of an embodiment of the first slew-rate enhancement circuit 14 according to the invention.

In FIG. 1, when the output voltage Vout becomes stable, the PMOS transistor P2 and NMOS transistor N2 are turned off. Therefore, the static power consumption due to the PMOS transistor P1 and the NMOS transistor N1 can be reduced because the static current passing through PMOS transistor P1 and the NMOS transistor N1 decreases due to the small size thereof FIG. 3 is a schematic diagram of an embodiment of the first slew-rate enhancement circuit 14 according to the invention. The PMOS transistor P21 comprises a source coupled to voltage VDD, a gate, and a drain coupled to the gate of PMOS transistor P21. The source of the PMOS transistor P22 is coupled to the drain of PMOS transistor P21, the drain of PMOS transistor P22 is coupled to the node C1, and the gate of PMOS transistor P22 is coupled to the node C. The drain of the NMOS transistor N22 is coupled to the node A, the gate of NMOS transistor N22 is coupled to the node C1 and the source of NMOS transistor N22 is coupled to a voltage VSS. When the input voltage Vin increases, the voltage level of the node C decreases, thus the PMOS transistor P22 is accordingly turned on, and the voltage level of the node C1 increases to turn on the NMOS transistor N22. When the NMOS transistor N22 is turned on, the voltage level of the node A is higher than that of the node C. It is noted that the PMOS transistors P21 and P23 and the NMOS transistor N21 can be regarded as a current source.

Figure 4:
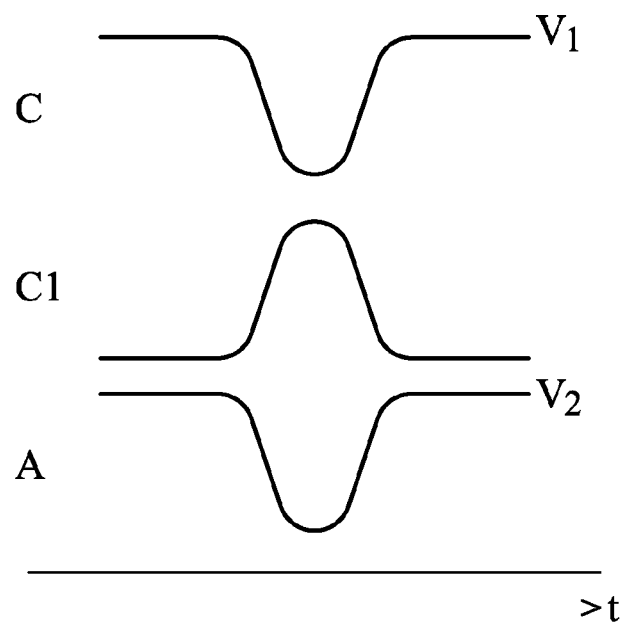
FIG. 4 shows the voltage variation of the nodes C, C1 and A of the FIG. 3.

For further description, please refer to FIG. 4. FIG. 4 shows the voltage variation of the nodes C, C1 and A of the FIG. 3. The initial voltage level of the node C is V1, and when the voltage level of the node C gradually decreases, the PMOS transistor P22 is accordingly conducted. It is known by those skilled in the art that the conductivity of the PMOS transistor P22 is determined based on the voltage received via its gate. Therefore, the PMOS transistor P22 is also turned on gradually and the voltage level of the node C1 is accordingly increased due to the voltage VDD. Since the voltage level of the node C1 gradually increases, the NMOS transistor N22 is accordingly conducted. It is known by those skilled in the art that the conductivity of the NMOS transistor is determined based on the voltage received via its gate. Therefore, the NMOS transistor N22 is also turned on gradually and the voltage level of the node A is accordingly decreased due to the voltage VSS.

When the voltage level of the node C starts to increase, the current passing through the PMOS transistor P22 decreases and the voltage level of the node C1 is accordingly decreased. Since the voltage level of the node C1 is decreased, the NMOS transistor N22 is also turned off gradually and the voltage level of the node A is accordingly increased due to the voltage VDD. In this embodiment, when the first slew-rate enhancement circuit 14 is at a stable state, the voltage level of the node C is at voltage V1 and the voltage level of the node A is at voltage V2. Furthermore, the voltage V2 is larger than voltage V1 to ensure that the PMOS transistor P2 in FIG. 1 can be completely turned off and the static current is accordingly eliminated.

Figure 5:
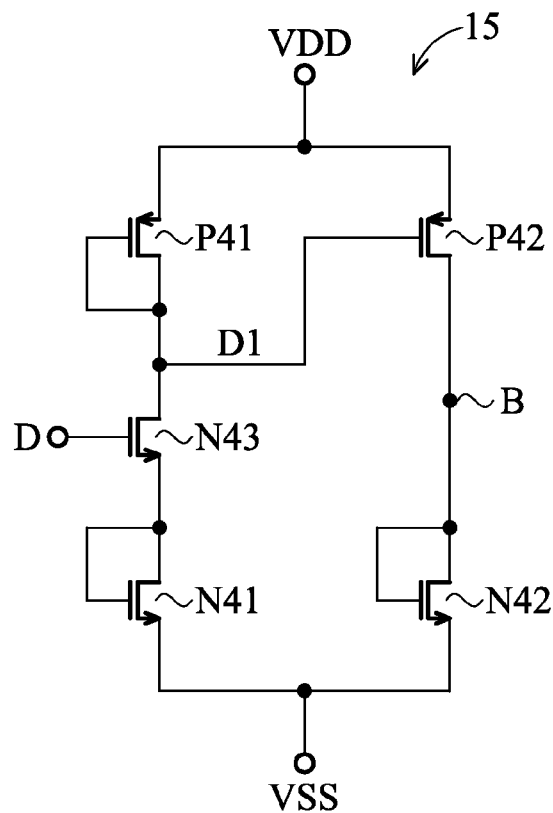
FIG. 5 is a schematic diagram of an embodiment of the second slew-rate enhancement circuit 15 according to the invention.

FIG. 5 is a schematic diagram of an embodiment of the second slew-rate enhancement circuit 15 according to the invention. The source of the PMOS transistor P41 is coupled to a voltage VDD, the gate and drain of PMOS transistor P41 are coupled to the node D1 and the gate of PMOS transistor P42. The gate of NMOS transistor N43 is coupled to the node D of FIG. 1, the drain of the NMOS transistor N43 is coupled to the node D1, and the source of NMOS transistor N43 is coupled to the drain and gate of the NMOS transistor N41. The sources of NMOS transistors N41 and N42 are coupled to the voltage VSS. The source of the PMOS transistor P42 is coupled to the voltage VDD and the drain of PMOS transistor P42 is coupled to the node B. The gate and drain of the NMOS transistor N42 are also coupled to the node B. When the input voltage Vin decreases, the voltage level of the node D increases, thus the NMOS transistor N43 is accordingly turned on, and the voltage level of the node D1 decreases to turn on the PMOS transistor P42. When the PMOS transistor P42 is turned on, the voltage level of the node B is lower than that of node D. It is noted that the PMOS transistors P41, P42 and NMOS transistor N41 can be regarded as current sources.

Figure 6:
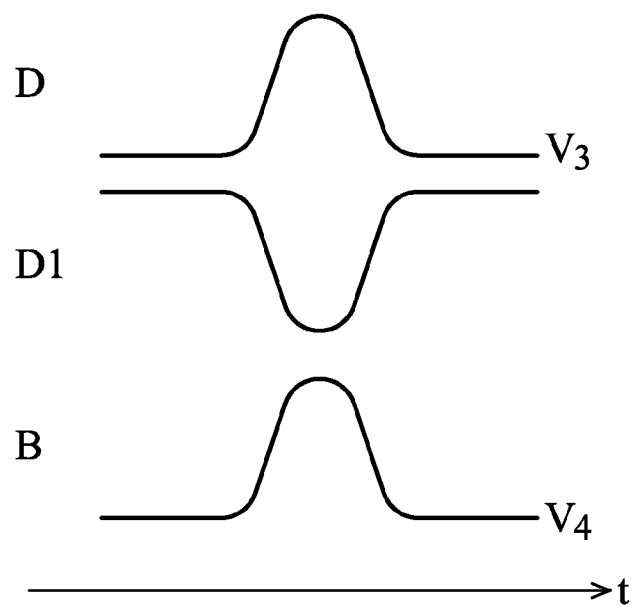
FIG. 6 shows the voltage variation of the nodes D, D1 and B of the FIG. 5.

For detail description, please refer to FIG. 6. FIG. 6 shows the voltage variation of the nodes D, D1 and B of the FIG. 5. The initial voltage level of the node D is V3, and when the voltage level of the node D gradually increases, the NMOS transistor N43 is accordingly conducted. It is known by those skilled in the art that the conductivity of the NMOS transistor is determined based on the voltage received via its gate. Therefore, the NMOS transistor N43 is also turned on gradually and the voltage level of the node D1 is accordingly decreased due to the voltage VSS. Since the voltage level of the node D1 gradually decreases, the PMOS transistor P42 is accordingly conducted. It is known by those skilled in the art that the conductivity of the NMOS or PMOS transistor is determined based on the voltage received via its gate. Therefore, the PMOS transistor P42 is also turned on gradually and the voltage level of the node B is accordingly increased due to the voltage VDD.

When the voltage level of the node D starts to decrease, the current passing through the NMOS transistor N43 decreases and the voltage level of the node D1 is accordingly increased. Since the voltage level of the node D1 is increased, the PMOS transistor P42 is also turned off gradually and the voltage level of the node B is accordingly decreased because the current passing through the PMOS transistor P42 is decreased. In this embodiment, when the second slew-rate enhancement circuit 15 is at a stable state, the voltage level of the node D is at voltage V3 and the voltage level of the node B is at voltage V4. Furthermore, the voltage V4 is lower than voltage V3 to ensure that the NMOS transistor N2 in FIG. 1 can be completely turned off and accordingly the static current is eliminated.

Figure 7:
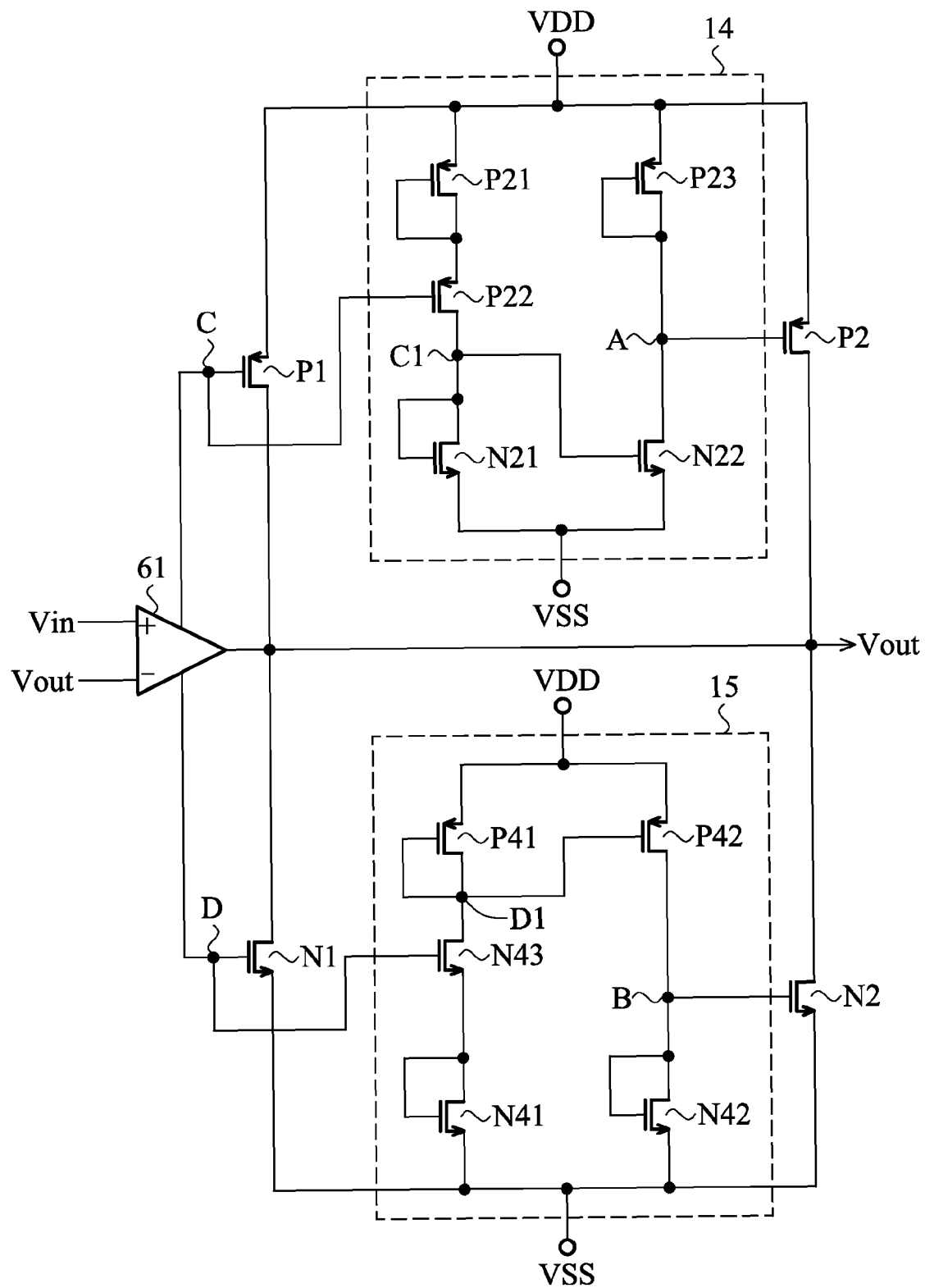
FIG. 7 is a circuit of an embodiment of an output buffer with slew-rate enhancement output stage according to the invention

As described, one method to decrease power consumption due to static current is to completely turn off the driving transistor. In the circuit of FIG. 1, the driving transistors are the PMOS transistor P2 and NMOS transistor N2. The conductivity of the transistor is determined based on the voltage received by the gate terminal. Thus, the first slew-rate enhancement circuit 14 and the second slew-rate enhancement circuit 15 are used to ensure that the PMOS transistor P2 and the NMOS transistor N2 can be completely turned off FIG. 7 is a circuit of an embodiment of an output buffer with slew-rate enhancement output stage according to the invention. The PMOS transistor P1 comprises a source coupled to voltage VDD, a gate terminal coupled to the node C and a drain coupled to the output of the operational amplifier 61. The NMOS transistor N1 comprises a drain coupled to the output of the operational amplifier 61, a gate coupled to the node D and a source coupled to voltage VSS. The PMOS transistor P2 comprises a source coupled to voltage VDD, a gate coupled to the node A and a drain coupled to the output of the operational amplifier 61. The NMOS transistor N2 comprises a drain coupled to the output of the operational amplifier 61, a gate coupled to the node B and a source coupled to voltage VSS.

The PMOS transistor P21 comprises a source coupled to voltage VDD, a gate and a drain coupled to the gate of PMOS transistor P21. The source of the PMOS transistor P22 is coupled to the drain of PMOS transistor P21, the drain of PMOS transistor P22 is coupled to the node C1, and the gate of PMOS transistor P22 is coupled to the node C. The drain of the NMOS transistor N22 is coupled to the node A, the gate of NMOS transistor N22 is coupled to the node C1 and the source of NMOS transistor N22 is coupled to voltage VSS. When the input voltage Vin increases, the voltage level of the node C decreases, thus the PMOS transistor P22 is accordingly turned on, and the voltage level of the node C1 increases to turn on the NMOS transistor N22. When the NMOS transistor N22 is turned on, the voltage level of the node A decreases.

The source of the PMOS transistor P41 is coupled to a voltage VDD, the gate and drain of PMOS transistor P41 are coupled to the node D1 and the gate of PMOS transistor P42. The gate of NMOS transistor N43 is coupled to the node D of FIG. 1, the drain of the NMOS transistor N43 is coupled to the node D1, and the source of NMOS transistor N43 is coupled to the drain and gate of the NMOS transistor N41. The sources of NMOS transistors N41 and N42 are coupled to voltage VSS. The source of the PMOS transistor P42 is coupled to the voltage VDD and the drain of PMOS transistor P42 is coupled to the node B. The gate and drain of the NMOS transistor N42 are also coupled to the node B. When the input voltage Vin decreases, the voltage level of the node D increases, thus the NMOS transistor N43 is accordingly turned on, and the voltage level of the node D1 decreases to turn on the PMOS transistor P22. When the PMOS transistor P42 is turned on, the voltage level of the node B increases.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A slew-rate enhancement output stage, comprising:
   a first slew-rate enhancement circuit receiving a first control voltage and outputting a first voltage, comprising:
      a first current source coupled to the high voltage source;
      a second PMOS transistor comprising a third first terminal coupled to the first current source, a third control terminal for receiving the first control voltage, and a third second terminal;
      a second current source coupled between the third second terminal of the second PMOS transistor and the low voltage source;
      a second NMOS transistor comprising a fourth first terminal coupled to the first control terminal, a fourth control terminal coupled to the third second terminal of the second PMOS transistor, and a fourth second terminal coupled to the low voltage source; and
      a third current source coupled between the high voltage source and the first control terminal, wherein the voltage level of the voltage output terminal varies according to the first control voltage;
   a second slew-rate enhancement circuit receiving a second control voltage and outputting a second voltage;
   a first PMOS transistor comprising a first first terminal coupled to a high voltage source, a first control terminal for receiving the first voltage, and a first second terminal coupled to a voltage output terminal; and
   a first NMOS transistor comprising a second first terminal coupled to the voltage output terminal, a second control terminal for receiving the second voltage, and a second second terminal coupled to a low voltage source, wherein the first voltage is higher than the first control voltage, and the second voltage is lower than the second control voltage.

2. The slew-rate enhancement output stage as claimed in claim 1, wherein the first current source and the third current source are implemented by PMOS transistors, and the second current source is implemented by an NMOS transistor.

3. A slew-rate enhancement output stage, comprising:
   a first slew-rate enhancement circuit receiving a first control voltage and outputting a first voltage;
   a second slew-rate enhancement circuit receiving a second control voltage and outputting a second voltage;
   a first PMOS transistor comprising a first first terminal coupled to a high voltage source, a first control terminal for receiving the first voltage, and a first second terminal coupled to a voltage output terminal; and
   a first NMOS transistor comprising a second first terminal coupled to the voltage output terminal, a second control terminal for receiving the second voltage, and a second second terminal coupled to a low voltage source, wherein the first voltage is higher than the first control voltage, and the second voltage is lower than the second control voltage;
   wherein the second slew-rate enhancement circuit comprises:
      a fourth current source coupled to the high voltage source;
      a third NMOS transistor comprising a fifth first terminal coupled to the fourth current source, a fifth control terminal for receiving the second control voltage, and a fifth second terminal;
      a fifth current source coupled between the fifth second terminal of the third NMOS transistor and the low voltage source;
      a third PMOS transistor comprising a sixth first terminal coupled to the high voltage source, a sixth control terminal coupled to the fifth first terminal of the third NMOS transistor, and a sixth second terminal coupled to the second control terminal; and
      a sixth current source coupled between the second control terminal and the low voltage source, wherein the voltage level of the voltage output terminal varies according to the second control voltage.

4. The slew-rate enhancement output stage as claimed in claim 3, wherein the fifth current source and the sixth current source are implemented by NMOS transistors, and the fourth current source is implemented by a PMOS transistor.

5. An output buffer with a slew-rate enhancement output stage, comprising:
   an operational amplifier comprising a positive input terminal for receiving an input voltage, a negative input terminal for receiving an output voltage, and an output terminal for outputting the output voltage;

a first PMOS transistor comprising a first first terminal coupled to a high voltage source, a first control terminal coupled to a first node inside the operational amplifier, and a first second terminal coupled to the output terminal of the operational amplifier;

a first NMOS transistor comprising a second first terminal coupled the output terminal of the operational amplifier, a second control terminal coupled to a second node inside the operational amplifier, and a second second terminal coupled to a low voltage source;

a first slew-rate enhancement circuit coupled to the first node and outputting a first voltage;

a second slew-rate enhancement circuit coupled to the second node and outputting a second voltage;

a second PMOS transistor comprising a third first terminal coupled to the high voltage source, a third control terminal for receiving the first voltage, and a third second terminal coupled to the output terminal of the operational amplifier; and a second NMOS transistor comprising a fourth first terminal coupled to the output terminal of the operational amplifier, a fourth control terminal for receiving the second voltage, and a fourth second terminal coupled to the low voltage source.

6. The output buffer as claimed in claim 5, wherein the first voltage is lower than the voltage level of the first node, and the second voltage is higher than the voltage level of the second node.

7. The output buffer as claimed in claim 5, wherein the first slew-rate enhancement circuit comprises:

a first current source coupled to the high voltage source;

a third PMOS transistor comprising a fifth first terminal coupled to the first current source, a fifth control terminal coupled to the first node, and a fifth second terminal;

a second current source coupled between the fifth second terminal of the third PMOS transistor and the low voltage source;

a third NMOS transistor comprising a sixth first terminal coupled to the third control terminal, a sixth control terminal coupled to the fifth second terminal of the third PMOS transistor, and a sixth second terminal coupled to the low voltage source; and a third current source coupled between the high voltage source and the third control terminal, wherein the voltage level of the output terminal varies according to the voltage level of the first node.

8. The output buffer as claimed in claim 7, wherein the first current source and the third current source are implemented by PMOS transistors, and the second current source is implemented by an NMOS transistor.

9. The output buffer as claimed in claim 8, wherein the fifth current source and the sixth current source are implemented by NMOS transistors, and the fourth current source is implemented by a PMOS transistor.

10. The output buffer as claimed in claim 5, wherein the second slew-rate enhancement circuit comprises:

a fourth current source coupled to the high voltage source;

a fourth NMOS transistor comprising a seventh first terminal coupled to the fourth current source, a seventh control terminal coupled to the second node, and a seventh second terminal;

a fifth current source coupled between the seventh second terminal of the fourth NMOS transistor and the low voltage source;

a fourth PMOS transistor comprising an eighth first terminal coupled to the high voltage source, an eighth control terminal coupled to the seventh first terminal of the fourth NMOS transistor, and an eighth second terminal coupled to the fourth control terminal; and a sixth current source coupled between the fourth control terminal and the low voltage source, wherein the voltage level of the voltage output terminal varies according to the voltage level of the second node.

* * * * *